United States Patent
Yamamoto et al.

(10) Patent No.: US 7,598,497 B2
(45) Date of Patent: Oct. 6, 2009

(54) CHARGED PARTICLE BEAM SCANNING METHOD AND CHARGED PARTICLE BEAM APPARATUS

(75) Inventors: Kouichi Yamamoto, Hikari (JP); Kaneo Kageyama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 222 days.

(21) Appl. No.: 11/892,332

(22) Filed: Aug. 22, 2007

(65) Prior Publication Data

US 2008/0054187 A1    Mar. 6, 2008

(30) Foreign Application Priority Data

Aug. 31, 2006    (JP) ............................. 2006-235869

(51) Int. Cl.
H01J 37/26    (2006.01)

(52) U.S. Cl. .................................. 250/396 R; 250/310

(58) Field of Classification Search ............. 250/396 R, 250/310
See application file for complete search history.

(56) References Cited

U.S. PATENT DOCUMENTS

| 7,375,330 | B2 * | 5/2008 | Inada et al. ................. 250/310 |
| 2004/0051040 | A1 | 3/2004 | Nasu et al. | |
| 2008/0093551 | A1 * | 4/2008 | Tsuneta et al. .............. 250/310 |

FOREIGN PATENT DOCUMENTS

JP    10-003876    1/1998

* cited by examiner

*Primary Examiner*—Kiet T Nguyen
(74) *Attorney, Agent, or Firm*—McDermott Will & Emery LLP

(57) ABSTRACT

A method and an apparatus for calculating a scan signal so that the scan region becomes a scan region which is based on magnification ratio between desired magnification in a scan-line interval direction and desired magnification in a scan-line direction, and performing a calculation for rotating the scan direction with respect to the scan signal in order to suppress a distortion which is caused to occur when the technology where the scan direction of a charged particle beam is rotated is applied to the technology where the charged particle beam is scanned such that the scan-line interval is enlarged.

11 Claims, 11 Drawing Sheets

WHEN MX = MY

WHEN MX ≠ MY

CHARGED PARTICLE BEAM SCANNING METHOD AND CHARGED PARTICLE BEAM APPARATUS

BACKGROUND OF THE INVENTION

1. Field of the Invention

The present invention relates to a charged particle beam scanning method and a charged particle beam apparatus. More particularly, it relates to a method and an apparatus for rotating the scan direction of a charged particle beam.

2. Description of the Related Art

At fabrication and inspection steps of a functional-device product fabricated by micromachining of its surface, such as a semiconductor device or thin-film magnetic head, a scanning electron microscope is widely used for performing measurement and external-appearance inspection of the micromachined pattern width.

The scanning electron microscope, which is one of charged particle beam apparatuses, is the following apparatus: An electron beam is emitted from an electron source, then being narrowly converged by a condenser lens and an objective lens. Next, the narrowly-converged beam is scanned on a sample in a one-dimensional or two-dimensional manner by using a deflector. Moreover, a secondary signal (i.e., secondary electrons, reflected electrons, and electromagnetic waves), which is generated from the sample by the electron-beam irradiation, is detected using a detector that utilizes photoelectric effect or the like. Finally, the sample image is formed by converting and processing the detected signal into a visual signal such as a luminance signal which is synchronized with the scanning with the electron beam.

In the scanning electron microscope, it turns out that the sample surface to be observed is irradiated with an electron beam having a-few-hundred-of-eV or more attainment energy.

In recent years, further microminiaturization has been implemented in the micromachining of the surface of a semiconductor device. In accompaniment with this trend, for example, it has been becoming more and more common to use, as photosensitive material for the photolithography, a photoresist which reacts with argon-fluoride (ArF) excimer laser light (this photoresist, hereinafter, will be referred to as "ArF resist").

Since the ArF laser light is significantly short in wavelength, i.e., 160 nm, the ArF resist is suitable for the exposure of a more microscopic circuit pattern. The ArF resist, however, is exceedingly vulnerable to the electron-beam irradiation. As a result, there has been known the following phenomenon: When the formed pattern is observed by using the scanning electron microscope, the scanning with the focused electron beam causes a condensation reaction to occur in the base material such as acrylic resin. As a result, volume of the ArF resist decreases (this volume decrease, hereinafter, will be referred to as "shrink"). This shrink results in a change in configuration of the circuit pattern.

In a semiconductor device, the implementation of its design performance requires that configuration and dimension of the circuit pattern be strictly managed. For this purpose, a critical dimension scanning electron microscope, which is capable of measuring a microscopic dimension, is used at the inspection step. Nevertheless, when, at the observation and measurement steps, the electron-beam irradiation for the measurement results in a change in the circuit-pattern configuration, it becomes impossible to obtain a desired design value as the circuit-pattern dimension. Accordingly, there exists a problem of causing occurrence of characteristics degradation or crash in the semiconductor device.

Moreover, since the line width changes, there exists the following problem: Even if the same dimension is measured, the resultant measurement value varies every time the measurement is made. This variation prevents the measurement accuracy from being enhanced.

In addressing this problem, in US 2004/0051040 A1, the proposal has been made concerning a method for lowering irradiation density of the focused electron beam thereby to suppress the shrink of the ArF resist. In an ordinary scanning electron microscope, magnification in the horizontal direction and magnification in the vertical direction are made to coincide with each other. In contrast thereto, the above-described irradiation-density lowering is implemented by setting the magnification in the vertical direction lower as compared with the magnification in the horizontal direction, and performing the scanning in such a manner that the scan-line interval is enlarged.

Also, in JP-A-10-3876, the disclosure has been made concerning the technology about the so-called raster rotation, which is a scanning method where the scan direction of an electron beam is rotated.

SUMMARY OF THE INVENTION

However, when the raster rotation is carried out in the scanning method disclosed in US 2004/0051040 A1 where the scanning is performed such that the scan-line interval is enlarged, there exists the following problem: Namely, the scan region is distorted into a parallelogram except for rotation angles of 0°, 90°, 180°, 270°, and proximities to these angles.

Furthermore, in JP-A-10-3876, no countermeasures are taken against the problem of such a distortion.

It is an object of the present invention to provide a charged particle beam scanning method and a charged particle beam apparatus which are preferable for suppressing a distortion. Here, this distortion is a one which is caused to occur when the technology where the scan direction of a charged particle beam is rotated is applied to the technology where the charged particle beam is scanned such that the scan-line interval is enlarged.

As an example for accomplishing the above-described object, in the present invention, the following method and apparatus are proposed: The method and apparatus calculate a scan signal so that the scan region becomes a scan region which is based on magnification ratio between desired magnification in a scan-line interval direction and desired magnification in a scan-line direction. Moreover, the method and apparatus perform a calculation for rotating the scan direction with respect to the scan signal calculated. The configuration like this makes it possible to calculate the scan signal for the rotation with respect to the scan signal on which the magnification ratio between the scan-line interval direction and the scan-line direction is reflected.

According to the configuration as described above, it becomes possible to implement the image rotation into an arbitrary angle without distorting the scan region even in the case where the rotation of the scan direction and the extension of the scan-line interval are executed.

DESCRIPTION OF THE INVENTION

In a measurement which uses a critical dimension scanning electron microscope (CD-SEM), obtaining a high measurement accuracy requires that the direction in which the measurement is to be performed and the scan direction be made to coincide with each other.

Figure 12A:
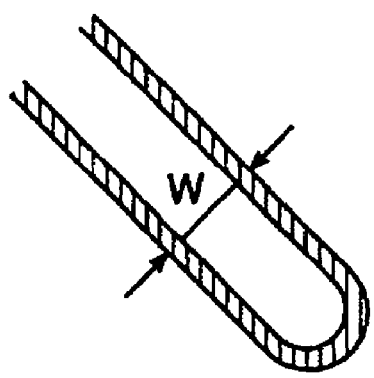
FIG. 12A to FIG. 12C are diagrams for illustrating the relationship between the direction in which the measurement is to be performed and the scan-line direction for performing the measurement with a high measurement accuracy in the critical dimension scanning electron microscope.
Figure 12B:
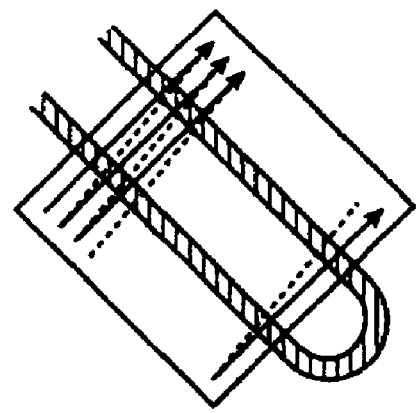
Figure 12C:
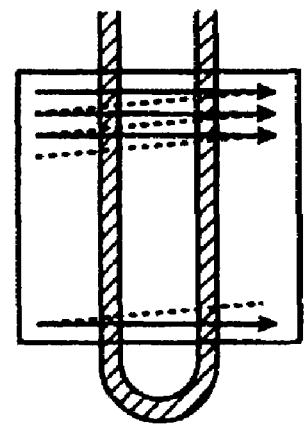

For example, when width of a wiring directed in an obliquely 45° direction is measured as illustrated in FIG. 12A, the measurement needs to be performed in such a manner that the direction in which the measurement is to be performed is made to coincide with the scan direction. Namely, as illustrated in FIG. 12B, the measurement is performed by carrying out the raster rotation to rotate the scan direction by 45°. Otherwise, as illustrated in FIG. 12C, the measurement is performed by rotating the sample by 45°.

Here, rotating the sample by 45° requires the employment of either of the following two methods: Namely, a method of setting up a rotation mechanism onto a sample stage, and a method of taking out the sample temporarily and re-throwing the sample in a state of being rotated by 45°. However, the method of setting up the rotation mechanism onto the sample stage leads to large-sized implementation and cost-up of the sample stage. Also, the method of taking out the sample temporarily and re-throwing the sample in the state of being rotated by 45° lengthens a time needed for measuring the sample.

Accordingly, the method of performing the measurement by carrying out the raster rotation to rotate the scan direction makes it possible to simplify structure of the sample stage, and also makes it possible to shorten the time needed for the measurement. Consequently, in this sense, the raster rotation is an excellent method. Nevertheless, when the raster rotation is applied to the scanning method of scanning the electron beam such that the scan-line interval is enlarged, the scan region is distorted into a parallelogram.

Referring to FIG. 6 and FIG. 7A to FIG. 7D, the explanation will be given below concerning a mechanism by which the scan region is distorted into a parallelogram when the raster rotation is carried out in the above-described scanning method.

Figure 6:
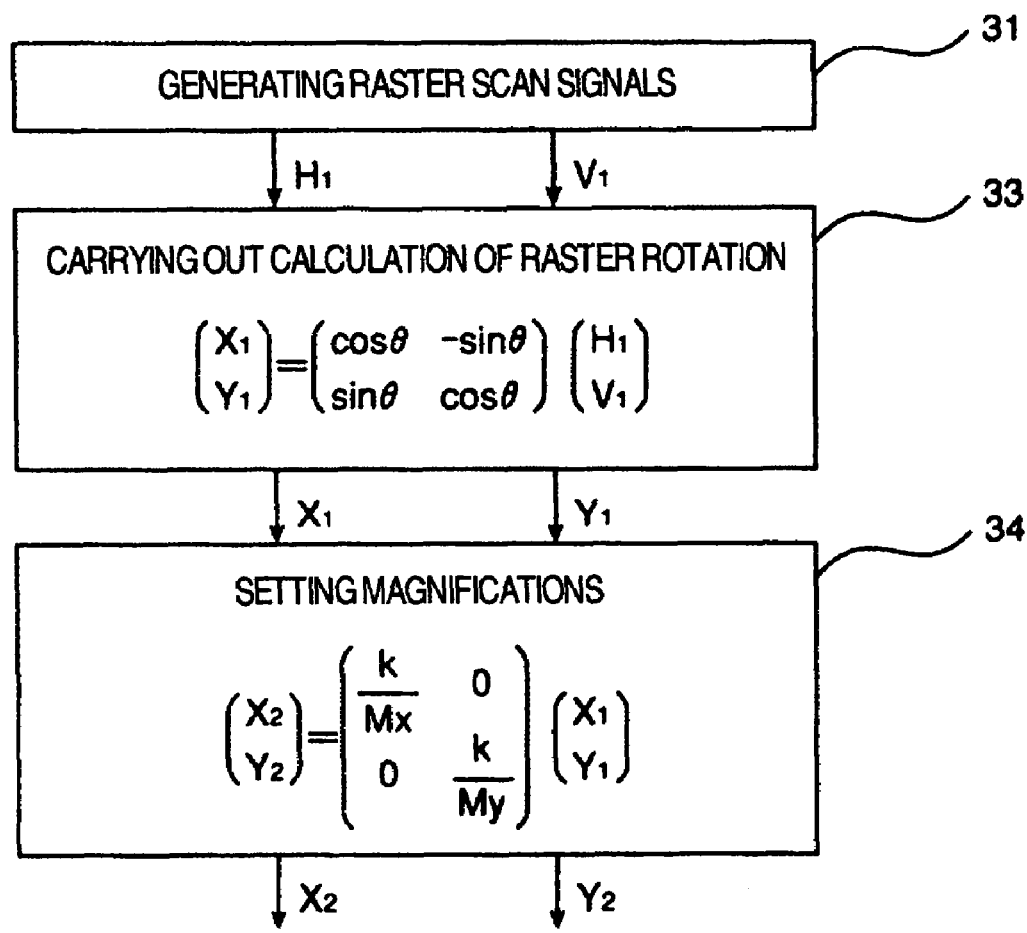
FIG. 6 is a flowchart for illustrating the calculation method for calculating the scan signals at the time of the raster rotation.
Figure 7A:
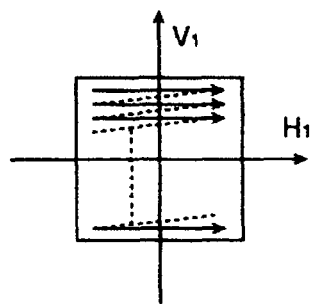
FIG. 7A to FIG. 7D are diagrams for illustrating trajectories of the scan signals at each step of the calculation of the scan signals in the scanning electron microscope.

FIG. 6 illustrates a calculation flow for calculating scan signals. Also, FIG. 7A to FIG. 7D illustrate trajectories of the scan signals outputted as a result of each calculation step of the scan signals. First, at a step 31, the so-called raster scan signals are generated. The raster scan signals are signals where the scan signal in the vertical direction changes on a line-by-line amount basis every time the scan signal in the horizontal direction changes from its minimum value to its maximum value. FIG. 7A illustrates trajectory of the scan signals H1 and V1 outputted as a result of the calculation at the step 31. After the step 31, the scan direction is rotated based on calculation of the raster rotation at a step 33. The calculation of the raster rotation is carried out by the following Expression:

$$\begin{pmatrix} X_1 \\ Y_1 \end{pmatrix} = \begin{pmatrix} \cos\theta & -\sin\theta \\ \sin\theta & \cos\theta \end{pmatrix} \begin{pmatrix} H_1 \\ V_1 \end{pmatrix} \quad \text{(Expression 1)}$$

Figure 7B:
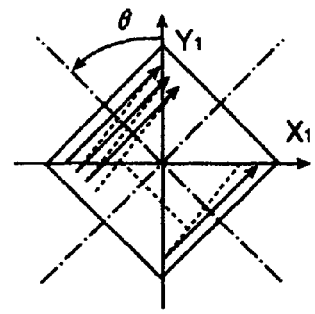

In (Expression 1), $\theta$ denotes the rotation angle of the scan direction. FIG. 7B illustrates trajectory of scan signals X1 and Y1 outputted as a result of the calculation at the step 33. It turns out that the trajectory of X1 and Y1 becomes a configuration which results from rotating the trajectory of H1 and V1 by $\theta°$. After the step 33, magnifications are set at a step 34. The setting of the magnifications is carried out by the following Expression:

$$\begin{pmatrix} X_2 \\ Y_2 \end{pmatrix} = \begin{pmatrix} \dfrac{k}{Mx} & 0 \\ 0 & \dfrac{k}{My} \end{pmatrix} \begin{pmatrix} X_1 \\ Y_1 \end{pmatrix} \quad \text{(Expression 2)}$$

In (Expression 2), Mx and My denote the magnification in the X direction and the magnification in the Y direction, respectively. It turns out that a scan signal X2 in the X direction and a scan signal Y2 in the Y direction become signals which are obtained by multiplying X1 and Y1 by coefficients inversely proportional to the magnifications Mx and My, respectively.

Figure 7C:
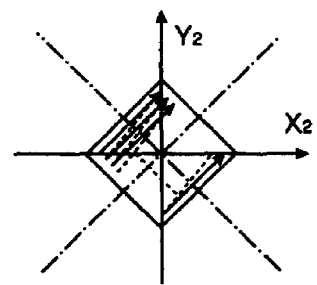

Here, in the ordinary scanning method where the magnification in the horizontal direction and the magnification in the vertical direction are made to coincide with each other, the magnification Mx in the X direction and the magnification My in the Y direction are set at an equal value. FIG. 7C illustrates trajectory of the scan signals X2 and Y2 outputted when Mx=My is set in the calculation at the step 34. The trajectory of X2 and Y2 remains geometrically similar to the trajectory of X1 and Y1, and only the scan region changes therebetween.

Figure 7D:
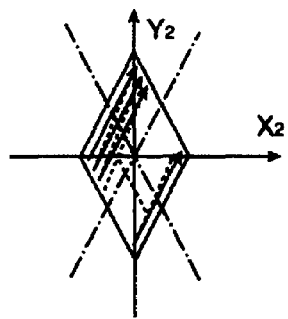

However, in the scanning method where the scan-line interval is enlarged by setting the magnification in the vertical direction lower as compared with the magnification in the horizontal direction, the magnification Mx in the X direction and the magnification My in the Y direction are set at different values. FIG. 7D illustrates trajectory of the scan signals X2 and Y2 outputted when Mx≠My is set in the calculation at the step 34. It turns out that the trajectory of X2 and Y2 becomes a configuration which is distorted into a parallelogram. The image obtained in the state where the scan region is distorted into the parallelogram turns out to be an image which extends in an oblique direction. As a result, it becomes impossible to perform the accurate measurement.

The scanning method where the scanning is performed such that the scan-line interval is enlarged is able to exhibit an effect of suppressing a change in the configuration with respect to a sample such as the ArF resist which will undergo the configuration change by the electron-beam irradiation. As is apparent from the above-described mechanism, however, this scanning method makes it impossible to perform the measurement into an arbitrary angle direction based on the raster rotation.

In the embodiments which will be explained hereinafter, the detailed explanation will be given below concerning a method or an apparatus which makes it possible to suppress a change in the configuration by enlarging the scan-line interval with respect to a sample such as the ArF resist which will undergo the configuration change by the electron-beam irradiation, and simultaneously, makes it possible to carry out the measurement into an arbitrary angle direction based on the raster rotation.

Figure 1:
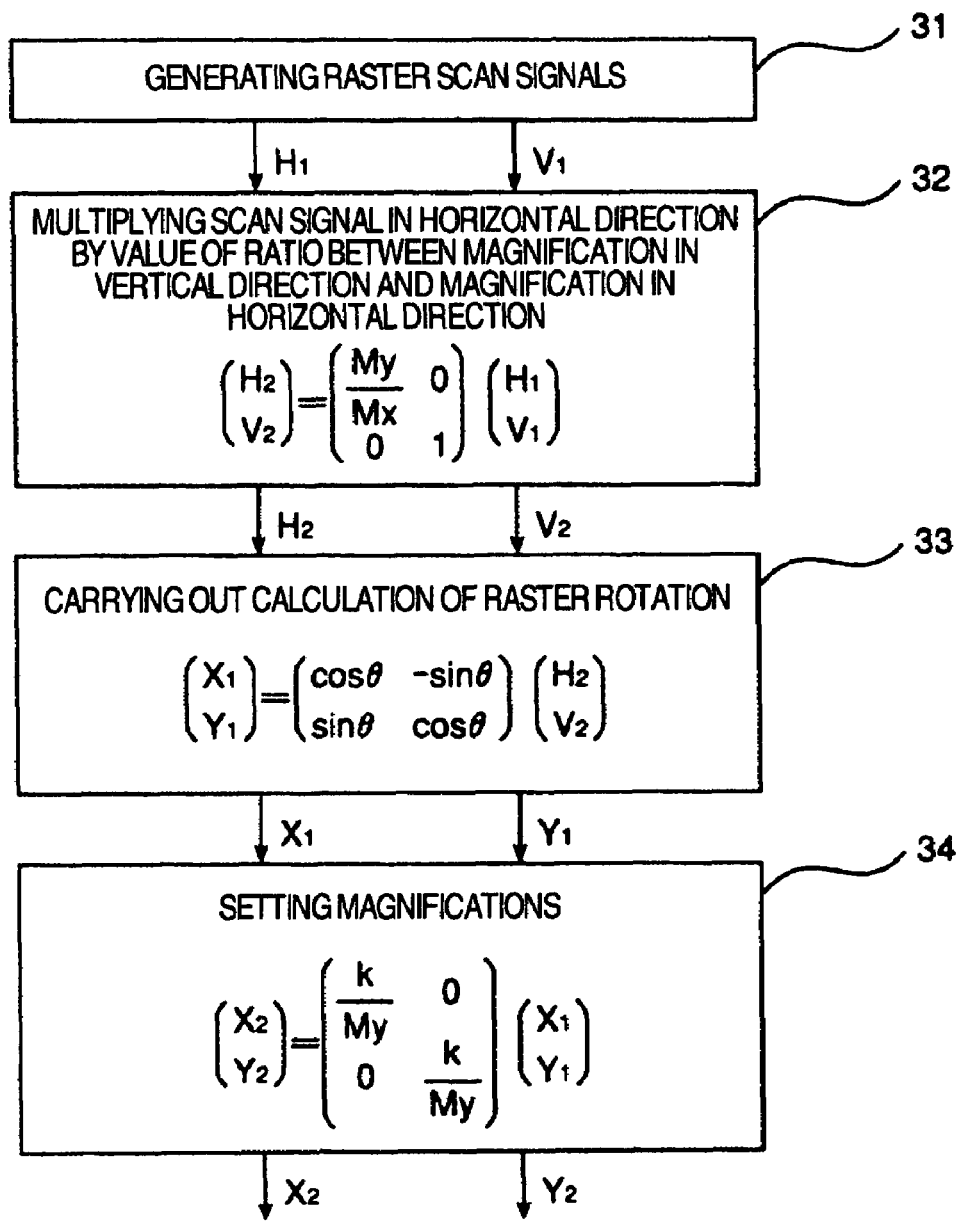
FIG. 1 is a flowchart for illustrating a calculation method for calculating scan signals in a scanning electron microscope.

FIG. 1 illustrates a calculation flow for calculating scan signals in the present embodiment. Also, FIG. 2A to FIG. 2D illustrate trajectories of the respective scan signals outputted as a result of the calculation flow illustrated in FIG. 1.

First, at a step 31, raster scan signals are generated. In the raster scan signals, the scan region in the X direction (i.e., scan-line direction) and the scan region in the Y direction (i.e., scan-line interval direction) are equal in size. When forming the image based on electrons emitted from a sample by the irradiation with an electron beam scanned by the raster scan signals, if the scan region in the X direction and the scan region in the Y direction are equal in size on a display apparatus, the magnification in the X direction and the magnification in the Y direction become the equal magnification.

Figure 2A:
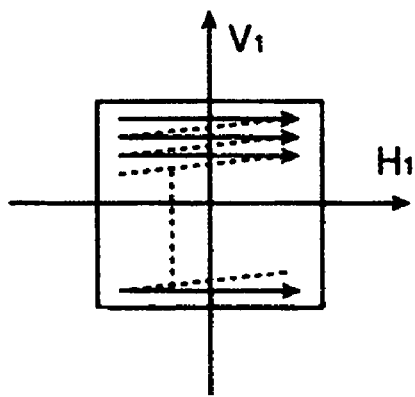
FIG. 2A to FIG. 2D are diagrams for illustrating trajectories of the scan signals at each step of the calculation of the scan signals in the scanning electron microscope.
Figure 2B:
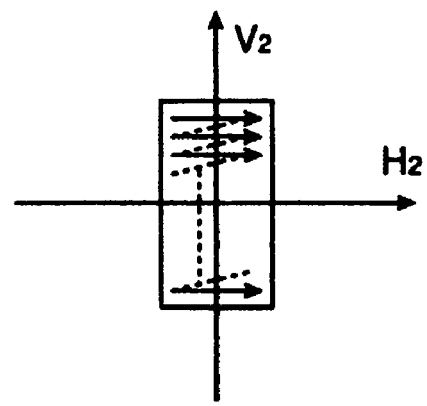
Figure 2C:
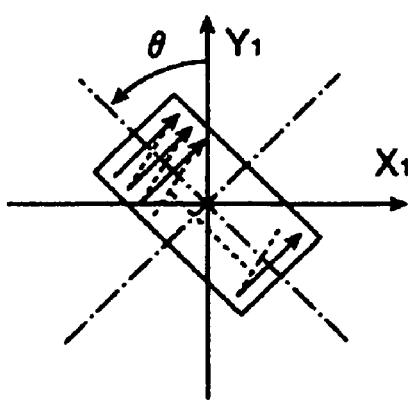
Figure 2D:
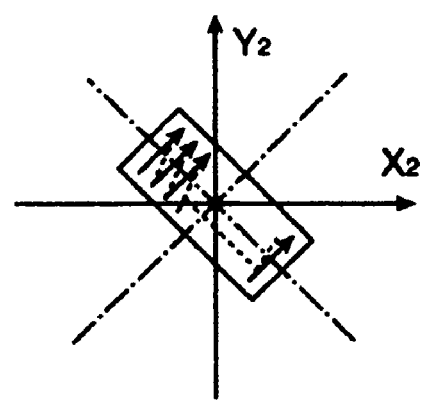

FIG. 2A illustrates trajectory of scan signals H1 and V1 outputted as a result of the calculation at the step 31. After the step 31, at a step 32, the scan signal H1 in the horizontal direction is multiplied by value My/Mx of the ratio between the magnification in the vertical direction and the magnification in the horizontal direction. FIG. 2B illustrates trajectory of scan signals H2 and V2 outputted as a result of the calculation at the step 32. It turns out that the trajectory of H2 and V2 becomes a rectangular configuration, and value of the ratio between the frequency in the horizontal direction and the frequency in the vertical direction becomes equal to My/Mx. After the step 32, the scan direction is rotated based on calculation of the raster rotation at a step 33. FIG. 2C illustrates trajectory of scan signals X1 and Y1 outputted as a result of the calculation at the step 33. It turns out that the trajectory of X1 and Y1 becomes a configuration which results from rotating the trajectory of H2 and V2 by 45° just as it is. After the step 33, magnifications are set at a step 34. At this time, the coefficient in the X direction and the coefficient in the Y direction are set at one and the same value, i.e., k/My. FIG. 2D illustrates trajectory of scan signals X2 and Y2 outputted as a result of the calculation at the step 34. The coefficient in the X direction and the coefficient in the Y direction are equal to each other. Accordingly, the trajectory of X2 and Y2 remains geometrically similar to the trajectory of X1 and Y1, and only the scan region changes therebetween. Namely, the scan region is not distorted into the parallelogram.

Figure 13:
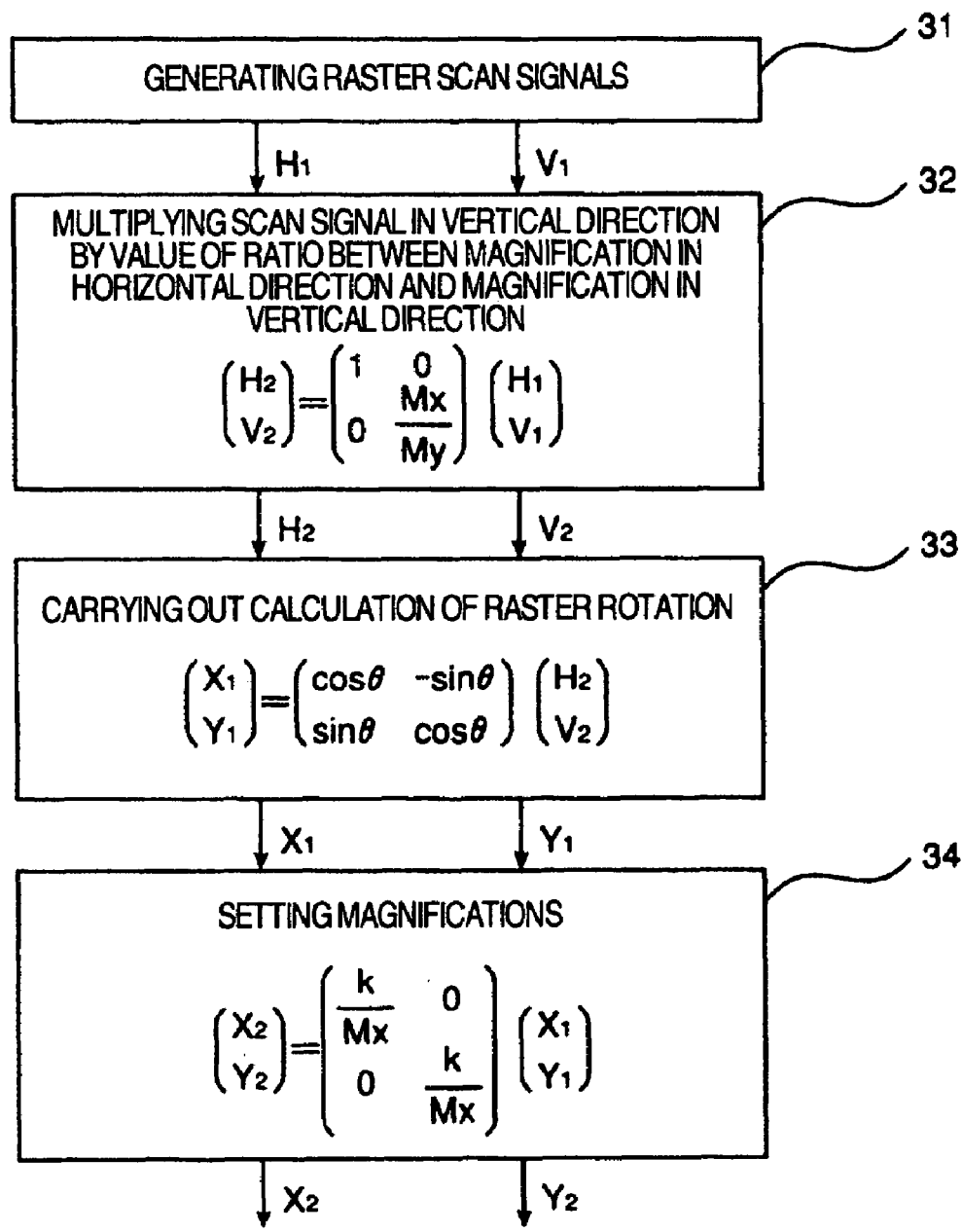
FIG. 13 is a flowchart for illustrating another embodiment of the calculation method for calculating the scan signals in the scanning electron microscope.

Incidentally, in substitution for the above-described calculation flow, the following operation is also allowable like a calculation flow illustrated in FIG. 13: Namely, the scan signal V1 in the vertical direction is multiplied by Mx/My at the step 32, and X1 and Y1 are multiplied by k/Mx at the step 34.

This allows the scan direction to be rotated at an arbitrary angle with the scan region maintained in the rectangular configuration.

By taking advantage of the scanning electron microscope in the present embodiment and the sample-dimension measurement method using the scanning electron microscope, it becomes possible to suppress a change in the configuration by enlarging the scan-line interval with respect to a sample such as the ArF resist which will undergo the configuration change by the electron-beam irradiation. Simultaneously, it becomes possible to carry out the measurement into an arbitrary angle direction based on the raster rotation.

Figure 3:
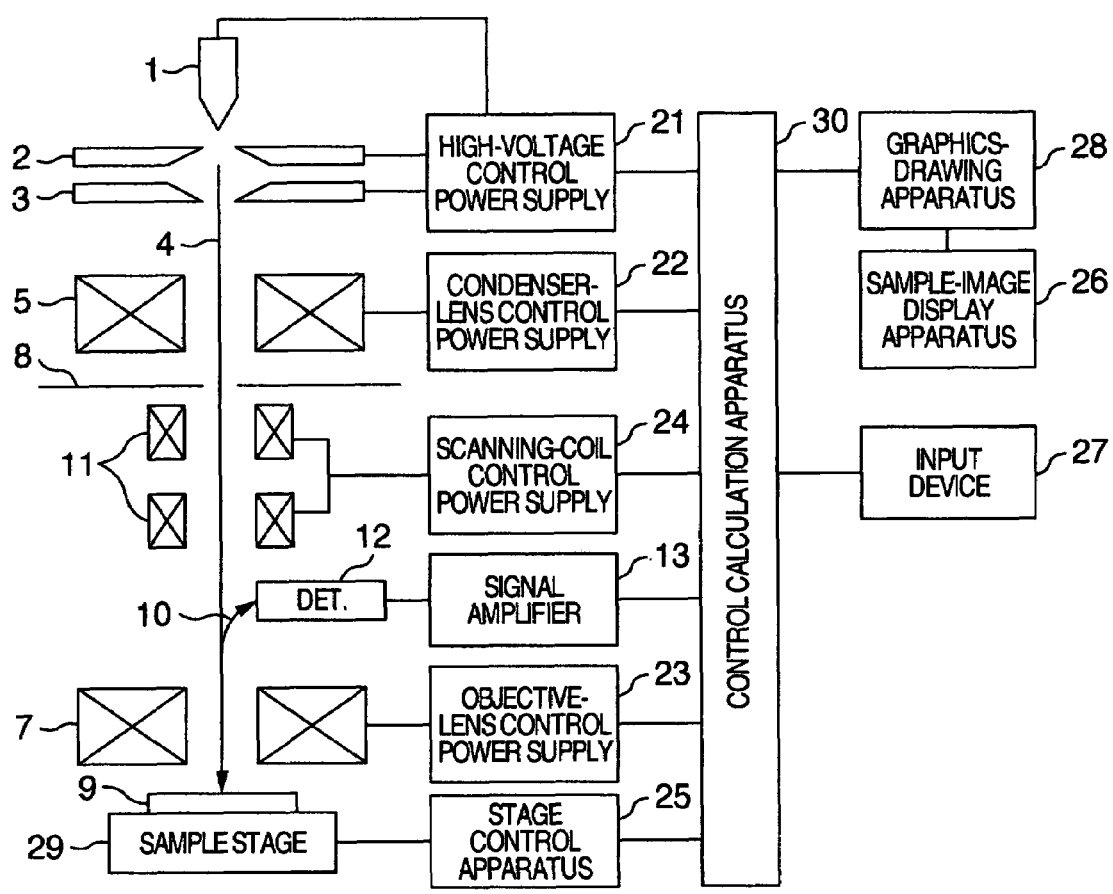
FIG. 3 is a diagram for explaining overview of the scanning electron microscope.

FIG. 3 is a diagram for illustrating configuration of a scanning electron microscope. Incidentally, in the present embodiment, the explanation will be given below selecting, as an example, the scanning electron microscope, i.e., an example of charged particle beam apparatuses. The present invention, however, is not limited thereto. The canning method which will be explained in the present embodiment is also applicable to another charged particle beam apparatus such as, e.g., a focused ion beam (FIB) apparatus for forming an image based on the scanning with an ion beam.

A voltage is applied between a cathode 1 and a first anode 2 by a high-voltage control power supply 21 controlled by a control calculation apparatus 30. This voltage application allows a predetermined emission current to be extracted from the cathode 1. An acceleration voltage is applied between the cathode 1 and a second anode 3 by the high-voltage control power supply 21. A primary electron beam 4 emitted from the cathode 1 is accelerated by the acceleration voltage, thus being made to travel toward a subsequent lens system. The primary electron beam 4 is focused by a condenser lens 5 controlled by a condenser-lens control power supply 22. An unnecessary region of the primary electron beam 4 is eliminated by a diaphragm plate 8. After that, the primary electron beam 4 is focused on a sample 9 as a microscopic spot by an objective lens 7 controlled by an objective-lens control power supply 23. In accordance with scanning address signals transmitted from the control calculation apparatus 30, the primary electron beam 4, which is focused on the sample 9 as the microscopic spot, is scanned on the sample 9 in a two-dimensional manner by a scanning-coil control power supply 24 and a scanning coil 11.

Secondary electrons 10 generated from the sample 9 by the irradiation with the primary electron beam 4 are detected by a secondary-electron detector 12. Incidentally, although the scanning electron microscope in the present embodiment includes the secondary-electron detector 12, the present invention is not limited thereto. Namely, instead of or together with the secondary-electron detector 12, the microscope can also include a reflected-electron detector for detecting reflected electrons, or a detector for detecting light, electromagnetic waves, or X-rays. A secondary-electron signal detected by the secondary-electron detector 12 is amplified by a signal amplifier 13, then being stored into an image memory inside a graphics-drawing apparatus 28. The scanning address signals transmitted to the scanning-coil control power supply 24 and addresses in the image memory are in a one-to-one correspondence relationship with each other. The two-dimensional image of a scan region of the electron beam by the scanning coil 11 is recorded into the image memory. The two-dimensional image recorded is displayed by a sample-image display apparatus 26.

The sample 9 is fixed on a sample stage 29 which is movable in a two-dimensional manner. The sample stage 29 is controlled by a stage control apparatus 25.

An input apparatus 27 functions as an interface between an operator and the control calculation apparatus 30. Via this input apparatus 27, the operator performs controls over the above-described respective units, and in addition, performs specification of a measurement point and instruction of a dimension measurement. Incidentally, the control calculation apparatus 30 is equipped with a storage apparatus, which allows storage of an obtained measurement value or the like.

Figure 4:
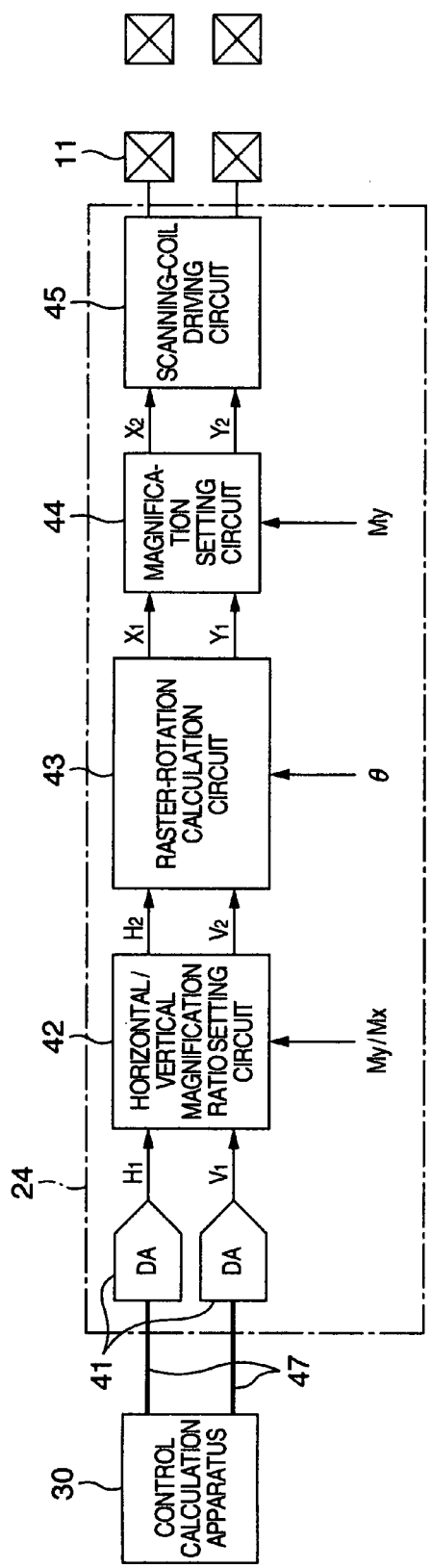
FIG. 4 is a circuit block diagram for illustrating an embodiment of a scanning-coil control power supply in the scanning electron microscope.

FIG. 4 illustrates an embodiment of the scanning-coil control power supply 24 which allows implementation of the calculation method for calculating the scan signals in the present embodiment. The scanning address signals 47 transmitted from the control calculation apparatus 30 are transmitted to the scanning-coil control power supply 24, where the analogue raster scan signals H1 and V1 are generated by DA converters 41.

A horizontal/vertical magnification ratio setting circuit 42 carries out the calculation at the step 32 illustrated in FIG. 1. As a result, the scan signals H2 and V2 are outputted in correspondence with the value My/Mx of the ratio between the magnification in the vertical direction and the magnification in the horizontal direction. A raster-rotation calculation circuit 43 carries out the calculation of the raster rotation at the step 33 illustrated in FIG. 1. As a result, the scan signals X1 and Y1 are outputted in correspondence with the rotation angle θ. A magnification setting circuit 44 carries out the calculation at the step 34 illustrated in FIG. 1. As a result, the scan signals X2 and Y2 are outputted in correspondence with the magnification My in the vertical direction. A scanning-coil driving circuit 45 causes an electric current proportional to the scan signals X2 and Y2 to flow through the scanning coil 11, thereby scanning the primary electron beam 4 in a two-dimensional manner.

Figure 5:
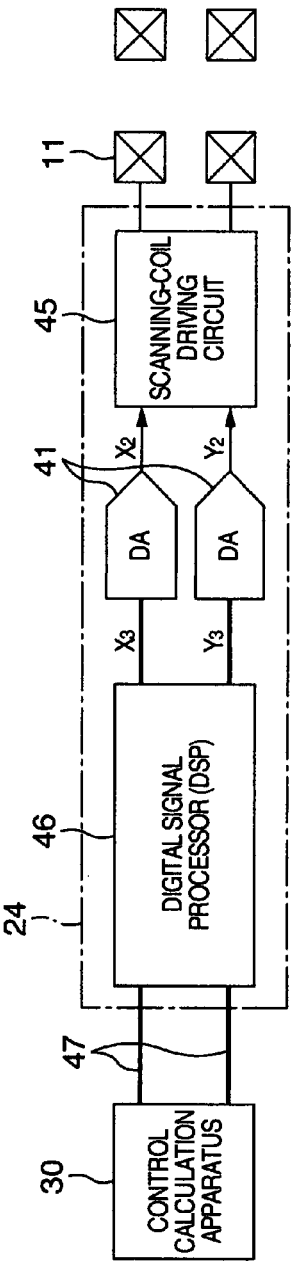
FIG. 5 is a circuit block diagram for illustrating another embodiment of the scanning-coil control power supply in the scanning electron microscope.

FIG. 5 illustrates another embodiment of the scanning-coil control power supply 24 which allows implementation of the calculation method for calculating the scan signals in the present embodiment. The scanning address signals 47 transmitted from the control calculation apparatus 30 are transmitted to the scanning-coil control power supply 24, then being inputted into a digital signal processor (DSP) 46. The digital signal processor (DSP) 46 carries out the calculations at the step 32 to the step 34 illustrated in FIG. 1. As a result, digital signals X3 and Y3 which are equivalent to the scan signals X2 and Y2 are transmitted to the DA converters 41. The DA converters 41 convert the digital signals X3 and Y3 into the analogue scan signals X2 and Y2. Then, the scanning-coil driving circuit 45 causes the electric current proportional to the scan signals X2 and Y2 to flow through the scanning coil 11, thereby scanning the primary electron beam 4 in a two-dimensional manner.

Figure 8:
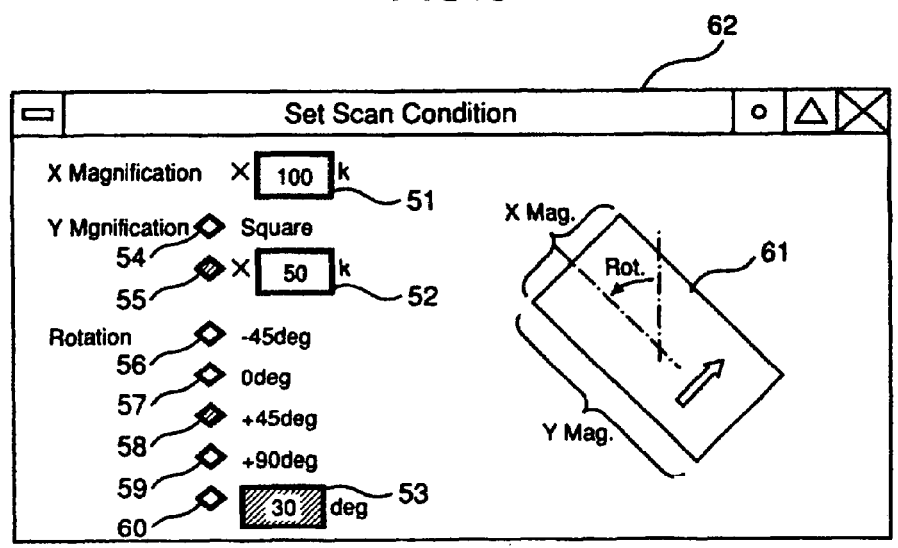
FIG. 8 is a diagram for illustrating an embodiment of an operation screen for implementing the scanning method in the scanning electron microscope.

FIG. 8 is a diagram for illustrating an embodiment of an operation screen for implementing the scanning method in the present embodiment. The magnification in the horizontal direction is inputted into an input box 51 on a window 62, and the magnification in the vertical direction is inputted into an input box 52. Incidentally, when carrying out the ordinary scanning method where the magnification in the horizontal direction and the magnification in the vertical direction become one and the same magnification, a "Square" button 54 may be pressed instead of specifying the magnification in the vertical direction. Also, the rotation angle is inputted into an input box 53. With respect to frequently used angles, the angles may be selected by pressing angle selection buttons 56 to 59 without inputting the numerical values.

For the user to confirm these settings easily, a graphical figure 61 for illustrating the scan region is indicated simultaneously.

Figure 9:
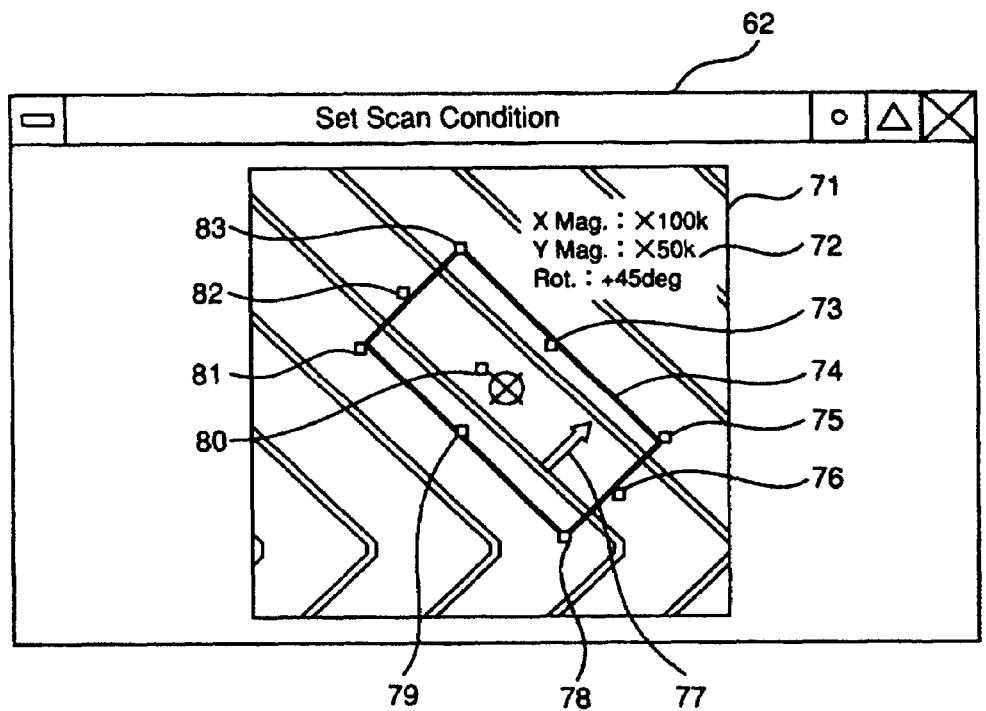
FIG. 9 is a diagram for illustrating another embodiment of the operation screen for implementing the scanning method in the scanning electron microscope.

Also, FIG. 9 is a diagram for illustrating another embodiment of the operation screen for implementing the scanning method in the present embodiment. An image 71 obtained in advance is indicated on a window 62, and the scan region is displayed in a manner of being superimposed thereon. Displacing handles 73 and 79 makes it impossible to specify the scanning range in the horizontal direction. Also, displacing handles 76 and 82 makes it impossible to specify the scanning range in the vertical direction. Also, displacing handles 75, 78, 81, and 83 makes it impossible to simultaneously modify the scanning range in the horizontal direction and the scanning range in the vertical direction. Also, displacing a handle 80 makes it impossible to specify the angle of the scan direction. The settings specified by the above-described operations are displayed on a display area 72 as the magnification in the horizontal direction, the magnification in the vertical direction, and the angle of the scan direction.

Figure 10:
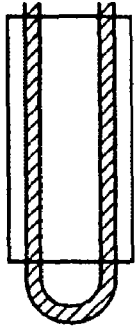
FIG. 10 is a diagram for illustrating an embodiment of a measurement method for measuring line pattern in a sample dimension measurement method in the scanning electron microscope.

FIG. 10 is a diagram for illustrating an embodiment of the measurement method of the present invention where the raster rotation is used in the scanning method of performing the scanning such that the scan-line interval is enlarged. Concretely, FIG. 10 illustrates examples of the scan region, the scan direction, and the sampled image in the case of measuring the line width of a line pattern.

The scan direction is set into a direction which is vertical to the line pattern. The magnification in the horizontal direction is so set as to match the line width of the line pattern. The magnification in the vertical direction is set so that the scan-line interval becomes larger than a predetermined value which gives rise to the change in the sample configuration.

FIG. 10 (a) illustrates a measurement method for measuring the line width of the line pattern when the line pattern is directed in the vertical direction. The angle of the raster rotation is set at 0°. Then, the scanning is performed in the direction vertical to the line pattern, thereby measuring the line width of the line pattern.

FIG. 10 (b) illustrates a measurement method for measuring the line width of the line pattern when the line pattern is directed in an obliquely 45° direction. The scan direction is rotated by 45° by the raster rotation. Then, the scanning is performed in the direction vertical to the line pattern, thereby measuring the line width of the line pattern.

FIG. 10 (c) illustrates a measurement method for measuring the line width of the line pattern when the line pattern is directed in the horizontal direction. The scan direction is rotated by 90° by the raster rotation. Then, the scanning is performed in the direction vertical to the line pattern, thereby measuring the line width of the line pattern.

Figure 11:
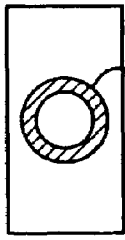
FIG. 11 is a diagram for illustrating an embodiment of a measurement method for measuring hole pattern in the sample dimension measurement method in the scanning electron microscope.

FIG. 11 is a diagram for illustrating another embodiment of the measurement method of the present invention where the raster rotation is used in the scanning method of performing the scanning such that the scan-line interval is enlarged. Concretely, FIG. 11 illustrates the embodiment in the case of measuring the diameter of a hole pattern.

The magnification in the horizontal direction is so set as to match the diameter of a hole pattern A. The magnification in the vertical direction is set so that the scan-line interval becomes larger than a predetermined value which gives rise to the change in the sample configuration. Then, as illustrated in FIG. 11(a) to FIG. 11(d), samplings of images are performed for the hole pattern A while rotating the scan direction. Incidentally, although, in the present embodiment, the rotation angle is set on each 45° basis, this may be set at another angle.

As illustrated in the field of "sampled image" in FIG. 11, the image obtained in each scan direction becomes an image of elliptic configuration. Here, major-axis length of the elliptic image is measured, then being defined as the diameter of the hole pattern A. Moreover, measurement values of the major-axis lengths obtained in the respective scan directions are averaged, then being defined as the definitive diameter of the hole pattern A.

Making the measurement as described above makes irradiation density of the electron beam uniform with respect to the circumferential direction of the hole pattern A. This makes it possible to uniformalize amount of the shrink with respect to the circumferential direction. Also, the definitive diameter of the hole pattern A is obtained by averaging the above-described measurement values in the circumferential direction. This makes it possible to reduce a variation in the measurement values.

Incidentally, as illustrated in FIG. 11, the images sampled in the respective scan directions become the ellipse-configured images all of which extend equally in the horizontal direction. Accordingly, instead of measuring the major-axis lengths of the ellipses and averaging the measurement values from the images obtained in the respective scan directions, the images obtained in the respective scan directions may be superimposed thereby to be merged into a piece of elliptic image. After that, the major-axis length of the resultant elliptic image may be measured then to be defined as the definitive diameter of the hole pattern A.

By taking advantage of the scanning electron microscope of the present invention and the sample-dimension measurement method using this microscope, with respect to a sample such as ArF resist which will undergo a change in the configuration by the electron-beam irradiation, it becomes possible to suppress the change in the configuration with respect to, e.g., width of an obliquely 45° direction line pattern, and to measure the width with a high accuracy. Also, it becomes possible to suppress a change in the configuration with respect to diameter of a hole pattern, and to measure the diameter with a high accuracy.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam scanning method for scanning a charged particle beam such that scan-line interval is enlarged when a sample is scanned with said charged particle beam in a two-dimensional manner, and forming image of said sample whose magnification in a scan-line interval direction becomes lower than whose magnification in a scan-line direction, said charged particle beam scanning method, comprising the steps of:

calculating value based on magnification ratio between desired magnification in said scan-line interval direction and desired magnification in said scan-line direction, calculating a first calculated scan signal by multiplying a scan signal in said scan-line interval direction or in said scan-line direction by said value based on said magnification ratio between said magnification in said scan-line interval direction and said magnification in said scan-line direction, carrying out a calculation for rotating scan direction with respect to said first calculated scan signal, and calculating second calculated scan signals in said scan-line interval direction and in said scan-line direction so that magnification ratio with respect to a scan signal becomes said desired magnification ratio, said scan signal resulting from carrying out said calculation for rotating said scan direction.

2. The charged particle beam scanning method according to claim 1, wherein said second calculated scan signals are calculated based on a coefficient based on said magnification in said scan-line interval direction, when said scan signal in said scan-line direction is multiplied by said value based on said magnification ratio between said magnification in said scan-line interval direction and said magnification in said scan-line direction, said second calculated scan signals being calculated based on a coefficient based on said magnification in said scan-line direction, when said scan signal in said scan-line interval direction is multiplied by said value based on said magnification ratio between said magnification in said scan-line interval direction and said magnification in said scan-line direction.

3. The charged particle beam scanning method according to claim 2, wherein said value based on said magnification ratio between said magnification in said scan-line interval direction and said magnification in said scan-line direction is equal to said magnification in said scan-line interval direction dividing said magnification in said scan-line direction, said scan signal in said scan-line direction being multiplied by said value, said value based on said magnification ratio between said magnification in said scan-line interval direction and said magnification in said scan-line direction being equal to said magnification in said scan-line direction dividing said magnification in said scan-line interval direction, said scan signal in said scan-line interval direction being multiplied by said value.

4. A charged particle beam scanning method for scanning a charged particle beam so that magnification in a scan-line interval direction becomes lower than magnification in a scan-line direction by changing scan-line interval, said charged particle beam scanning method, comprising the steps of:

calculating a scan signal in said scan-line direction or in said scan-line interval direction based on magnification ratio between desired magnification in said scan-line direction and desired magnification in said scan-line interval direction, carrying out a calculation for rotating scan direction of said charged particle beam with respect to said scan signal, and calculating scan signals in said scan-line direction and in said scan-line interval direction so that magnifications become said desired magnification in said scan-line direction and said desired magnification in said scan-line interval direction with respect to a scan signal, said scan signal resulting from carrying out said calculation for said rotation.

5. The charged particle beam scanning method according to claim 4, wherein said scan signal calculated based on said magnification ratio between said magnification in said desired scan-line direction and said magnification in said scan-line interval direction is determined by multiplying said scan signal in said scan-line direction, or said scan signal in said scan-line interval direction by value based on said in said scan-line interval direction and said magnification in said scan-line direction, or said magnification in said scan-line direction and said magnification in said scan-line interval direction.

6. The charged particle beam scanning method according to claim 4, wherein said calculation for rotating said scan direction of said charged particle beam is carried out with respect to said scan signal to which said calculation is applied, said calculation being based on said magnification ratio between said magnification in said scan-line direction and said magnification in said scan-line interval direction.

7. A charged particle beam apparatus, comprising:

a charged particle beam source, a deflector for scanning a charged particle beam on a sample, said charged particle beam being emitted from said charged particle beam source, and a control apparatus for controlling a signal supplied to said deflector, wherein said control apparatus calculates a scan signal so that scan region becomes a scan region which is based on magnification ratio between set magnification in a scan-line direction and set magnification in a scan-line interval direction, carries out a calculation for rotating scan direction of said charged particle beam with respect to said scan signal, and calculates scan signals corresponding to said set magnification in said scan-line direction and said set magnification in said scan-line interval direction with respect to a scan signal, said scan signal resulting from carrying out said calculation for said rotation.

8. The charged particle beam apparatus according to claim 7, further comprising:

a display apparatus capable of setting said magnification in said scan-line direction, said magnification in said scan-line interval direction, and rotation angle of said scan direction.

9. The charged particle beam apparatus according to claim 7, wherein said magnification in said scan-line interval direction is lower than said magnification in said scan-line direction.

10. A calculation apparatus for calculating scan signals based on set magnifications and set rotation angle of scan direction, said scan signals being supplied to a charged particle beam apparatus, wherein said calculation apparatus multiplies said scan signal in a scan-line direction, or said scan signal in a scan-line interval direction by value based on magnification ratio between magnification Mx and magnification My, said magnification Mx being set in a scan-line direction of a charged particle beam, said magnification My being set in a scan-line interval direction of said charged particle beam and being set at a lower magnification than said magnification Mx, and carries out a rotation calculation with respect to said scan signal multiplied by said value based on said magnification ratio between said magnifications Mx and My, said rotation calculation being based on said set rotation angle.

11. The calculation apparatus according to claim 10, wherein, in performing said multiplication, said calculation apparatus calculates $$\begin{pmatrix} H_2 \\ V_2 \end{pmatrix} = \begin{pmatrix} \frac{My}{Mx} & 0 \\ 0 & 1 \end{pmatrix} \begin{pmatrix} H_1 \\ V_1 \end{pmatrix},$$

or $$\begin{pmatrix} H_2 \\ V_2 \end{pmatrix} = \begin{pmatrix} 1 & 0 \\ 0 & \frac{Mx}{My} \end{pmatrix} \begin{pmatrix} H_1 \\ V_1 \end{pmatrix}$$

where $H_1$ is scan signal in scan-line direction, $H_2$ is signal outputted as a result of calculation on scan signal in scan-line direction, $V_1$ is scan signal in scan-line interval direction, and $V_2$ is signal outputted as a result of calculation on scan signal in scan-line interval direction.

* * * * *